(12) United States Patent
Maeda et al.

(10) Patent No.: US 11,415,875 B2
(45) Date of Patent: Aug. 16, 2022

(54) MASK BLANK, PHASE SHIFT MASK, AND METHOD FOR MANUFACTURING SEMICONDUCTOR DEVICE

(71) Applicant: HOYA CORPORATION, Tokyo (JP)

(72) Inventors: Hitoshi Maeda, Tokyo (JP); Ryo Ohkubo, Tokyo (JP); Yasutaka Horigome, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 17/231,282

(22) Filed: Apr. 15, 2021

(65) Prior Publication Data

US 2021/0255538 A1    Aug. 19, 2021

Related U.S. Application Data

(63) Continuation of application No. 16/970,601, filed as application No. PCT/JP2019/000138 on Jan. 8, 2019, now Pat. No. 11,009,787.

(30) Foreign Application Priority Data

Feb. 22, 2018 (JP) ................................ 2018-029428

(51) Int. Cl.
*G03F 1/32* (2012.01)
*H01L 21/033* (2006.01)
*G03F 1/38* (2012.01)

(52) U.S. Cl.
CPC .............. *G03F 1/32* (2013.01); *G03F 1/38* (2013.01); *H01L 21/0332* (2013.01); *H01L 21/0337* (2013.01)

(58) Field of Classification Search
None
See application file for complete search history.

(56) References Cited

U.S. PATENT DOCUMENTS

| 5,514,499 A | 5/1996 | Iwamatsu et al. |
| 5,538,816 A | 7/1996 | Hashimoto et al. |

(Continued)

FOREIGN PATENT DOCUMENTS

| JP | H0728224 A | 1/1995 |
| JP | H07134392 A | 5/1995 |

(Continued)

OTHER PUBLICATIONS

U.S. Appl. No. 16/970,601, "Notice of Allowance", dated Feb. 22, 2021, 9 pages.

(Continued)

*Primary Examiner* — Roberts P Culbert
(74) *Attorney, Agent, or Firm* — Kilpatrick Townsend & Stockton LLP

(57) ABSTRACT

A mask blank in which a phase shift film provided on a light-permeable substrate includes at least a nitrogen-containing layer and an oxygen-containing layer, the nitrogen-containing layer is made from a silicon nitride-based material and the oxygen-containing layer is made from a silicon oxide-based material, wherein, when the nitrogen-containing layer is subjected to X-ray photoelectron spectroscopy to obtain a maximum peak $PSi\_f$ of photoelectron intensity of a Si2p narrow spectrum and the light-permeable substrate is subjected to X-ray photoelectron spectroscopy to obtain a maximum peak $PSi\_s$ of photoelectron intensity of a Si2p narrow spectrum, the numerical value $(PSi\_f)/(PSi\_s)$, which is produced by dividing the maximum peak $PSi\_f$ in the nitrogen-containing layer by the maximum peak $PSi\_s$ in the light-permeable substrate, is 1.09 or less.

19 Claims, 3 Drawing Sheets

(56) References Cited

U.S. PATENT DOCUMENTS

| | | |
|---|---|---|
| 5,609,977 A | 3/1997 | Iwamatsu et al. |
| 5,686,209 A | 11/1997 | Iwamatsu et al. |
| 6,274,280 B1 | 8/2001 | Carcia |
| 6,723,477 B2 | 4/2004 | Nozawa et al. |
| 10,915,016 B2 | 2/2021 | Nozawa et al. |
| 2002/0058186 A1 | 5/2002 | Nozawa et al. |
| 2008/0129130 A1 | 6/2008 | Mun et al. |

FOREIGN PATENT DOCUMENTS

| | | |
|---|---|---|
| JP | H10171096 A | 6/1998 |
| JP | 2002162726 A | 6/2002 |
| JP | 2002535702 A | 10/2002 |
| JP | 2002341515 A | 11/2002 |
| JP | 2006276648 A | 10/2006 |
| JP | 2017146628 A | 8/2017 |
| WO | 2016158649 A1 | 10/2016 |

OTHER PUBLICATIONS

PCT/JP2019/000138, "English Translation of International Search Report", dated Mar. 19, 2019, 2 pages.

MASK BLANK, PHASE SHIFT MASK, AND METHOD FOR MANUFACTURING SEMICONDUCTOR DEVICE

CROSS-REFERENCE TO RELATED APPLICATIONS

This application is a continuation of U.S. application Ser. No. 16/970,601, filed Jan. 8, 2019, which is a National Stage of International Application No. PCT/JP2019/000138, filed Jan. 8, 2019, which claims priority to Japanese Patent Application No. 2018-029428, filed Feb. 22, 2018, and the entire contents of which is incorporated by reference in its entirety.

TECHNICAL FIELD

This disclosure relates to a mask blank and a phase shift mask manufactured using the mask blank. This disclosure also relates to a method for manufacturing a semiconductor device using the above-mentioned phase shift mask.

BACKGROUND ART

In a manufacturing process of a semiconductor device, formation of a fine pattern is carried out using photolithography. For the formation of the fine pattern, a number of transfer masks are normally used. In order to miniaturize a pattern of the semiconductor device, it is necessary to shorten a wavelength of an exposure light source used in the photolithography in addition to miniaturization of mask patterns formed on the transfer masks. In recent years, an ArF excimer laser (wavelength of 193 nm) is increasingly used as the exposure light source upon manufacturing the semiconductor device.

As one type of the transfer masks, a halftone phase shift mask is known. The halftone phase shift mask has a light-transmitting portion allowing exposure light to be transmitted therethrough and a phase shift portion (of a halftone phase shift film) allowing the exposure light to be transmitted therethrough in an attenuated state, and substantially reverses (with a phase difference of about 180 degrees) a phase of the exposure light transmitted through the phase shift portion with respect to a phase of the exposure light transmitted through the light-transmitting portion. Due to the phase difference, a contrast of an optical image at a boundary between the light-transmitting portion and the phase shift portion is enhanced so that the halftone phase shift mask becomes a high-resolution transfer mask.

The halftone phase shift mask has a tendency that a transferred image has a higher contrast as the halftone phase shift film has a higher transmittance with respect to the exposure light. Therefore, mainly in case where an especially high resolution is required, a so-called high-transmittance halftone phase shift mask is used. For the phase shift film of the halftone phase shift mask, a molybdenum silicide (MoSi) based material is widely used. However, it has recently been found out that an MoSi-based film is low in resistance against exposure light of the ArF excimer laser (so-called ArF lightfastness).

As the phase shift film of the halftone phase shift mask, an SiN-based material comprising silicon and nitrogen is also known and is disclosed in, for example, Patent Document 1. Furthermore, as a technique for obtaining desired optical characteristics, Patent Document 2 discloses a halftone phase shift mask using a phase shift film comprising a periodic multilayer film including Si oxide layers and Si nitride layers. Patent Document 2 describes that a predetermined phase difference is obtained at a transmittance of 5% with respect to light having a wavelength of 157 nm, i.e., $F_2$ excimer laser light. Since the SiN-based material has high ArF lightfastness, attention is focused on a high-transmittance halftone phase shift mask using the SiN-based film as the phase shift film.

PRIOR ART DOCUMENT(S)

Patent Document(s)

Patent Document 1: JP H7-134392 A
Patent Document 2: JP 2002-535702 A

SUMMARY OF THE INVENTION

Problem to be Solved by the Invention

In case where a single-layer phase shift film of a silicon nitride material is used, restriction is imposed on a transmittance with respect to exposure light of the ArF excimer laser (hereinafter referred to as ArF exposure light). It is therefore difficult to increase the transmittance to more than 18% in view of optical characteristics of the material.

By introducing oxygen into silicon nitride, the transmittance can be increased. However, if a single-layer phase shift film of a silicon oxynitride material is used, there is a problem that, when the phase shift film is patterned by dry etching, etching selectivity is reduced with respect to a transparent substrate formed of a material containing silicon oxide as a main component.

As a method of resolving the above-mentioned problem, for example, a method of forming a phase shift film into a two-layer structure comprising a silicon nitride layer and a silicon oxide layer arranged in this order from the transparent substrate is conceivable. Patent Document 1 discloses the halftone phase shift mask having the phase shift film of the two-layer structure comprising the silicon nitride layer and the silicon oxide layer arranged in this order from the transparent substrate.

By forming the phase shift film into the two-layer structure comprising the silicon nitride layer and the silicon oxide layer, a degree of freedom in refractive index with respect to the ArF exposure light, extinction coefficient and film thickness is increased so that the phase shift film of the two-layer structure has a desired transmittance and a desired phase difference with respect to the ArF exposure light. However, as a result of thorough study, it has been found out that the halftone phase shift mask having the phase shift film of the two-layer structure comprising the silicon nitride layer and the silicon oxide layer has problems which will hereinafter be described.

As compared with the above-mentioned MoSi-based film, both of the silicon nitride layer and the silicon oxide layer are considerably high in ArF lightfastness. However, the silicon nitride layer is low in ArF lightfastness as compared with the silicon oxide layer. Thus, in case where the phase shift mask is manufactured using a mask blank having the phase shift film mentioned above and the phase shift mask is set in an exposure apparatus and repeatedly subjected to exposure transfer by the ArF exposure light, a line width of a pattern of the phase shift film tends to be thickened at a part in the silicon nitride layer as compared with a part in the silicon oxide layer. Accordingly, there is a problem that, although the part in the silicon oxide layer is hardly thickened against repeated irradiation with the ArF exposure light, thickening of the line width of the pattern in the entire phase shift film becomes relatively large when the phase shift film is subjected to the repeated irradiation with the ArF exposure light.

Both of the silicon nitride layer and the silicon oxide layer are considerably high in resistance (chemical resistance) against a chemical solution used in cleaning or the like, as compared with the above-mentioned MoSi-based film. However, the silicon nitride layer is low in chemical resistance as compared with the silicon oxide layer. Thus, in case where cleaning with the chemical solution is repeatedly carried out in the middle of manufacturing the phase shift mask from the mask blank having the above-mentioned phase shift film or after the phase shift mask is manufactured, the line width of the pattern of the phase shift film could easily be reduced at the part in the silicon nitride layer as compared with the part in the silicon oxide layer. Accordingly, there is a problem that, although the silicon oxide layer is high in chemical resistance, the amount of reduction in line width of the pattern in the entire phase shift film becomes relatively large when cleaning with the chemical solution is repeatedly carried out.

On the other hand, in case where the above-mentioned phase shift film having the two-layer structure has a configuration in which a material forming a high-transmission layer is changed from silicon oxide into silicon oxynitride, it is possible to obtain optical characteristics similar to those in case where the high-transmission layer is formed of silicon oxide. However, even in case of the phase shift film having the above-mentioned configuration, there arise the problems of the ArF lightfastness and the chemical resistance.

This disclosure has been made in order to solve the above-mentioned problems. It is an aspect of this disclosure to provide a mask blank which has a phase shift film formed on a transparent substrate and at least containing a nitrogen-containing layer, such as a silicon nitride layer, and an oxygen-containing layer, such as a silicon oxide layer, and which is for use in a halftone phase shift mask and is improved in ArF lightfastness and chemical resistance in the entire phase shift film.

In addition, it is an aspect of this disclosure to provide a phase shift mask manufactured using the above-mentioned mask blank.

Furthermore, it is an aspect of this disclosure to provide a method for manufacturing the above-mentioned phase shift mask.

Moreover, it is an aspect of this disclosure to provide a method for manufacturing a semiconductor device using the above-mentioned phase shift mask.

Means to Solve the Problem

In order to solve the above-mentioned problems, this disclosure has the following configurations.

(Configuration 1)

A mask blank comprising a transparent substrate and a phase shift film formed thereon, wherein the phase shift film at least contains a nitrogen-containing layer and an oxygen-containing layer;

wherein the oxygen-containing layer is formed of a material consisting of silicon and oxygen or a material consisting of oxygen, silicon, and one or more elements selected from metalloid elements and non-metal elements;

wherein the nitrogen-containing layer is formed of a material consisting of silicon and nitrogen or a material consisting of nitrogen, silicon, and one or more elements selected from non-metal elements and metalloid elements; and wherein, when the nitrogen-containing layer is subjected to X-ray photoelectron spectroscopy to obtain a maximum peak PSi_f of photoelectron intensity of an Si2p narrow spectrum in the nitrogen-containing layer and the transparent substrate is subjected to the X-ray photoelectron spectroscopy to obtain a maximum peak PSi_s of photoelectron intensity of an Si2p narrow spectrum in the transparent substrate, a numerical value (PSi_f)/(PSi_s) is 1.09 or less where the numerical value is obtained by dividing the maximum peak PSi_f in the nitrogen-containing layer by the maximum peak PSi_s in the transparent substrate.

(Configuration 2)

The mask blank according to Configuration 1, wherein the nitrogen-containing layer has a nitrogen content of 50 atomic % or more.

(Configuration 3)

The mask blank according to Configuration 1 or 2, wherein the oxygen-containing layer has a total content of nitrogen and oxygen of 50 atomic % or more.

(Configuration 4)

The mask blank according to any one of Configurations 1 to 3, wherein the oxygen-containing layer has an oxygen content of 15 atomic % or more.

(Configuration 5)

The mask blank according to any one of Configurations 1 to 4, wherein the maximum peak of photoelectron intensity in the Si2p narrow spectrum is the maximum peak at a bond energy within a range of 96 [eV] or more and 106 [eV] or less.

(Configuration 6)

The mask blank according to any one of Configurations 1 to 5, wherein X-rays emitted to the phase shift film in the X-ray photoelectron spectroscopy are AlKα rays.

(Configuration 7)

The mask blank according to any one of Configurations 1 to 6, wherein a ratio obtained by dividing the number of existing $Si_3N_4$ bonds in the nitrogen-containing layer by a total number of the existing $Si_3N_4$ bonds, existing $Si_aN_b$ bonds (where b/[a+b]<4/7), existing Si—Si bonds, existing Si—O bonds, and existing Si—ON bonds is 0.88 or more.

(Configuration 8)

The mask blank according to any one of Configurations 1 to 7, wherein the phase shift film has a function of allowing exposure light of an ArF excimer laser to be transmitted therethrough at a transmittance of 10% or more and a function of causing a phase difference of 150 degrees or more and 200 degrees or less between the exposure light transmitted through the phase shift film and the exposure light transmitted through air for a same distance as a thickness of the phase shift film.

(Configuration 9)

The mask blank according to any one of Configurations 1 to 8, comprising a light shielding film formed on the phase shift film.

(Configuration 10)

A phase shift mask comprising a transparent substrate and a phase shift film with a transfer pattern formed thereon, wherein the phase shift film at least includes a nitrogen-containing layer and an oxygen-containing layer;

wherein the oxygen-containing layer is formed of a material consisting of silicon and oxygen or a material consisting of oxygen, silicon, and one or more elements selected from metalloid elements and non-metal elements;

wherein the nitrogen-containing layer is formed of a material consisting of silicon and nitrogen or a material consisting of nitrogen, silicon, and one or more elements selected from non-metal elements and metalloid elements; and wherein, when the nitrogen-containing layer is subjected to X-ray photoelectron spectroscopy to obtain a maximum peak PSi_f of photoelectron intensity of an Si2p narrow spectrum in the nitrogen-containing layer and the transparent substrate is subjected to the X-ray photoelectron spectroscopy to obtain a maximum peak PSi_s of photoelectron intensity of an Si2p narrow spectrum in the transparent substrate, a numerical value (PSi_f)/(PSi_s) is 1.09 or less where the numerical value is obtained by dividing the maximum peak PSi_f in the nitrogen-containing layer by the maximum peak PSi_s in the transparent substrate (Configuration 11)

The phase shift mask according to Configuration 10, wherein the nitrogen-containing layer has a nitrogen content of 50 atomic % or more.

(Configuration 12)

The phase shift mask according to Configuration 10 or 11, wherein the oxygen-containing layer has a total content of nitrogen and oxygen of 50 atomic % or more.

(Configuration 13)

The phase shift mask according to any one of Configurations 10 to 12, wherein the oxygen-containing layer has an oxygen content of 15 atomic % or more.

(Configuration 14)

The phase shift mask according to any one of Configurations 10 to 13, wherein the maximum peak of photoelectron intensity in the Si2p narrow spectrum is the maximum peak at a bond energy within a range of 96 [eV] or more and 106 [eV] or less.

(Configuration 15)

The phase shift mask according to any one of Configurations 10 to 14, wherein X-rays emitted to the phase shift film in the X-ray photoelectron spectroscopy are AlKα rays.

(Configuration 16)

The phase shift mask according to any one of Configurations 10 to 15, wherein a ratio obtained by dividing the number of existing $Si_3N_4$ bonds in the nitrogen-containing layer by a total number of the existing $Si_3N_4$ bonds, existing $Si_aN_b$ bonds (where b/[a+b]<4/7), existing Si—Si bonds, existing Si—O bonds, and existing Si—ON bonds is 0.88 or more.

(Configuration 17)

The phase shift mask according to any one of Configurations 10 to 16, wherein the phase shift film has a function of allowing exposure light of an ArF excimer laser to be transmitted therethrough at a transmittance of 10% or more and a function of causing a phase difference of 150 degrees or more and 200 degrees or less between the exposure light transmitted through the phase shift film and the exposure light transmitted through air for a same distance as a thickness of the phase shift film.

(Configuration 18)

The phase shift mask according to any one of Configurations 10 to 17, comprising a light shielding film formed on the phase shift film and provided with a light shielding pattern.

(Configuration 19)

A method of manufacturing a semiconductor device, comprising the step of exposure-transferring a transfer pattern onto a resist film on a semiconductor substrate, using the phase shift mask according to any one of Configurations 10 to 18.

Effect of the Invention

A mask blank according to this disclosure, comprising a transparent substrate and a phase shift film formed thereon, wherein the phase shift film at least contains a nitrogen-containing layer and an oxygen-containing layer; wherein the oxygen-containing layer is formed of a material consisting of silicon and oxygen or a material consisting of oxygen, silicon, and one or more elements selected from metalloid elements and non-metal elements; wherein the nitrogen-containing layer is formed of a material consisting of silicon and nitrogen or a material consisting of nitrogen, silicon, and one or more elements selected from non-metal elements and metalloid elements; and wherein, when the nitrogen-containing layer is subjected to X-ray photoelectron spectroscopy to obtain a maximum peak PSi_f of photoelectron intensity of an Si2p narrow spectrum in the nitrogen-containing layer and the transparent substrate is subjected to the X-ray photoelectron spectroscopy to obtain a maximum peak PSi_s of photoelectron intensity of an Si2p narrow spectrum in the transparent substrate, a numerical value (PSi_f)/(PSi_s) is 1.09 or less where the numerical value is obtained by dividing the maximum peak PSi_f in the nitrogen-containing layer by the maximum peak PSi_s in the transparent substrate. By forming the mask blank into the above-mentioned structure, it is possible to improve ArF lightfastness and chemical resistance in the entire phase shift film.

A phase shift mask according to this disclosure is characterized in that a phase shift film having a transfer pattern is similar in structure to the phase shift film of the above-mentioned mask blank of this disclosure. By forming the phase shift mask as mentioned above, it is possible to improve ArF lightfastness and chemical resistance in the entire phase shift film. Accordingly, the phase shift mask according to this disclosure is high in transfer accuracy when exposure transfer is carried out on a transfer object such as a resist film on a semiconductor substrate.

A method for manufacturing a semiconductor device according to this disclosure is characterized by comprising a step of exposure-transferring a transfer pattern to a resist film on a semiconductor substrate by using the above-mentioned phase shift mask of this disclosure. Therefore, by the method for manufacturing the semiconductor device according to this disclosure, it is possible to carry out exposure transfer of the transfer pattern to the resist film with high transfer accuracy.

MODE FOR EMBODYING THE INVENTION

Figure 1:
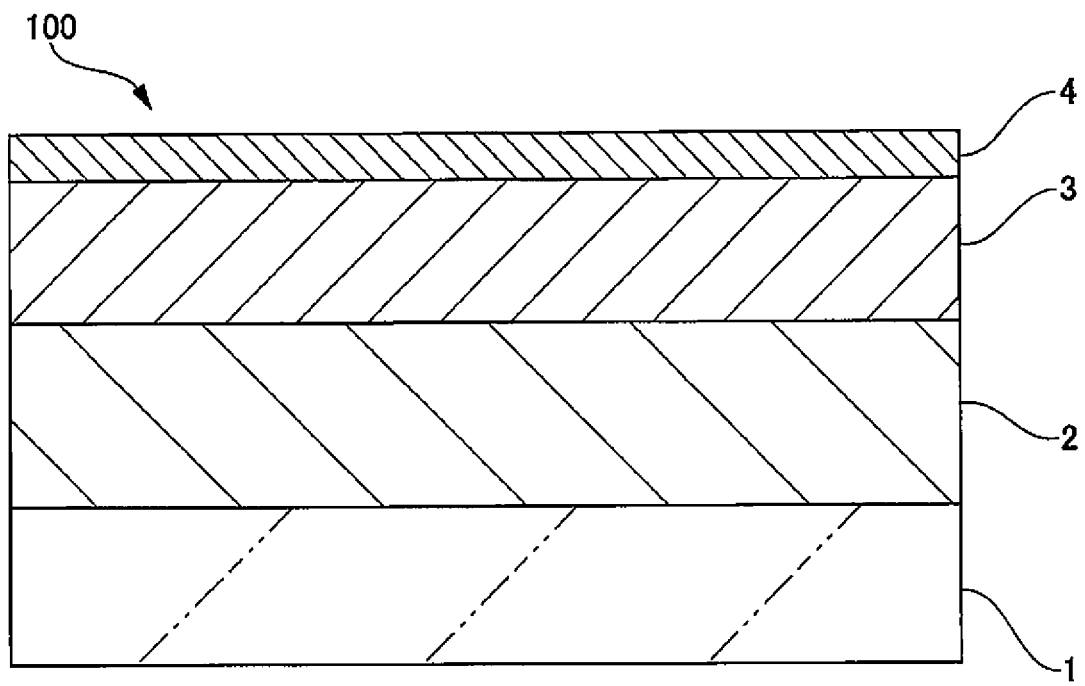
FIG. 1 is a sectional view for illustrating a configuration of a mask blank in an embodiment of this disclosure.

At first, a process leading to completion of this disclosure will be described. With respect to a case where a phase shift film of a mask blank has a layered structure comprising a silicon nitride-based material film (nitrogen-containing layer) and a silicon oxide-based material layer (oxygen-containing layer), the present inventors conducted a research in view of ArF lightfastness and chemical resistance of the phase shift film.

It is supposed that a line width of a pattern of a silicon-based material layer is thickened under irradiation with ArF exposure light because volume expansion occurs due to progress of a reaction in which silicon atoms bonded with other elements (including other silicon atoms) are excited to break those bonds and then bonded with oxygen. Therefore, in case of a silicon oxide-based material layer in which a large amount of silicon already bonded with oxygen are present at a stage before irradiation with the ArF exposure light, a pattern line width is hardly thickened due to the volume expansion even under the irradiation with the ArF exposure light. Furthermore, silicon bonded with oxygen is difficult to be dissolved in a chemical solution as compared with silicon bonded with other elements except oxygen.

By making the silicon nitride-based material layer contain oxygen, it is possible to improve the ArF lightfastness and the chemical resistance. However, when the silicon nitride-based material layer contains oxygen, a refractive index n and an extinction coefficient k are inevitably decreased and the degree of freedom in designing the phase shift film is significantly lowered. Therefore, the above-mentioned means is difficult to apply.

As a result of diligent research, the present inventors reached an idea that the ArF lightfastness in the entire phase shift film might be improved if, among silicon nitride-based materials, a silicon nitride-based material in which silicon is hardly excited when it is irradiated with the ArF exposure light is used as the silicon nitride-based material layer.

The present inventors conceived of an idea of using X-ray photoelectron spectroscopy (XPS) as an index indicating whether or not silicon in the silicon nitride-based material layer is easily excited when the layer is irradiated with the ArF exposure light. At first, it has been considered to carry out the X-ray photoelectron spectroscopy on the silicon nitride-based material layer to acquire an Si2p narrow spectrum and to use a difference in maximum peak thereof as the index. The maximum peak of photoelectron intensity of the Si2p narrow spectrum in the silicon nitride-based material layer corresponds to the number of photoelectrons emitted from nitrogen-silicon bonds per unit time. The photoelectrons are electrons which are excited in response to irradiation with X-rays and ejected from an atomic orbital. A material which is easily excited and emits a large number of photoelectrons when it is irradiated with the X-rays is a material having a small work function. The silicon nitride-based material having the small work function is said to be a material easily excited in response to the irradiation with the ArF exposure light also.

However, the number of photoelectrons detected by the X-ray photoelectron spectroscopy varies depending on measurement conditions (the type of the X-rays to be used, irradiation intensity, and so on) even in the same silicon nitride-based material layer and, therefore, cannot directly be used as the index. As a result of research about this problem, the inventors reached an idea of using, as the index, a numerical value obtained by dividing the maximum peak of photoelectron intensity of the Si2p narrow spectrum in the silicon nitride-based material layer by the maximum peak of photoelectron intensity of the Si2p narrow spectrum in the transparent substrate.

The transparent substrate is formed of a relatively stable material containing $SiO_2$ as a main component. The transparent substrate used in the mask blank is required to be very small in variation of the material, for example, small in variation of optical characteristics. Therefore, variation in work function of each material is very small among a plurality of transparent substrates. In case of the same measurement conditions, a difference in maximum peak of photoelectron intensity of the Si2p narrow spectrum is small among different transparent substrates. Therefore, an influence of a difference in measurement conditions is significantly reflected on the maximum peak of photoelectron intensity. The maximum peak of photoelectron intensity of the Si2p narrow spectrum in the transparent substrate is the number of photoelectrons emitted from the oxygen-silicon bonds per unit time but is a suitable reference value to correct the difference in maximum peak of photoelectron intensity of the Si2p narrow spectrum in the silicon nitride-based material layer due to the difference in measurement conditions.

As a result of a further diligent research, the present inventors reached a conclusion that, in a mask blank having a phase shift film at least containing a silicon nitride-based material layer (nitrogen-containing layer) and a silicon oxide-based material layer (oxygen-containing layer) which are formed on a transparent substrate, ArF lightfastness can be improved if, in case where the X-ray photoelectron spectroscopy is carried out on the silicon nitride-based material layer and the transparent substrate, a numerical value $(PSi\_f)/(PSi\_s)$ is 1.09 or less where the numerical value is obtained by dividing the maximum peak $PSi\_f$ of photoelectron intensity of an Si2p narrow spectrum in the silicon nitride-based material layer by the maximum peak $PSi\_s$ of photoelectron intensity of an Si2p narrow spectrum in the transparent substrate.

On the other hand, in the silicon nitride-based material layer with the above-mentioned numerical value $(PSi\_f)/(PSi\_s)$ of 1.09 or less, silicon in the layer is hardly excited in response to the irradiation with the ArF exposure light. Such a silicon nitride-based material layer is said to have a high abundance ratio of nitrogen-silicon bonds in a strong bonding condition. When the silicon nitride-based material layer is contacted by a chemical solution, the nitrogen-silicon bonds are difficult to be broken and difficult to be dissolved in the chemical solution.

As a result of the above-mentioned diligent research, a mask blank of this disclosure has been derived. Specifically, the mask blank according to this disclosure comprises a transparent substrate and a phase shift film formed thereon. The phase shift film at least contains a nitrogen-containing layer (silicon nitride-based material layer) and an oxygen-containing layer (silicon oxide-based material layer). The oxygen-containing layer is formed of a material consisting of silicon and oxygen or a material consisting of oxygen, silicon, and one or more elements selected from metalloid elements and non-metal elements. The nitrogen-containing layer is formed of a material consisting of silicon and nitrogen or a material consisting of nitrogen, silicon, and one or more elements selected from non-metal elements and metalloid elements. When the nitrogen-containing layer is subjected to the X-ray photoelectron spectroscopy to obtain a maximum peak $PSi\_f$ of photoelectron intensity of an Si2p narrow spectrum in the nitrogen-containing layer and the transparent substrate is subjected to the X-ray photoelectron spectroscopy to obtain a maximum peak $PSi\_s$ of photoelectron intensity of an Si2p narrow spectrum in the transparent substrate, a numerical value $(PSi\_f)/(PSi\_s)$ is equal to 1.09 or less where the numerical value is obtained by dividing the maximum peak PSi_f in the nitrogen-containing layer by the maximum peak PSi_s in the transparent substrate.

Next, an embodiment of this disclosure will be described. A mask blank according to this disclosure is applicable to a mask blank for use in producing a phase shift mask. Hereinafter, description will be made of a mask blank for use in manufacturing a halftone phase shift mask.

FIG. 1 is a sectional view for illustrating a configuration of a mask blank 100 according to the embodiment of this disclosure. The mask blank 100 illustrated in FIG. 1 has a structure in which a phase shift film 2, a light shielding film 3, and a hard mask film 4 are formed as layers on a transparent substrate 1 in this order.

The transparent substrate 1 may be formed of a glass material such as synthetic quartz glass, quartz glass, aluminosilicate glass, soda lime glass, and low-thermal-expansion glass ($SiO_2$—$TiO_2$ glass or the like). Among others, the synthetic quartz glass is particularly preferable as a material for use in forming the transparent substrate of the mask blank because of a high transmittance with respect to ArF excimer laser light (wavelength of 193 nm).

The phase shift film 2 is required to have a transmittance allowing a phase shift effect to effectively function. The phase shift film 2 is at least required to have a transmittance of 1% or more with respect to ArF exposure light. The phase shift film 2 preferably has a transmittance of 10% or more, more preferably 15% or more, further preferably 20% or more, with respect to the ArF exposure light.

The phase shift film 2 is preferably adjusted to have a transmittance of 40% or less, more preferably 30% or less, with respect to the ArF exposure light.

In recent years, NTD (Negative Tone Development) has become used as an exposure and development process for a resist film on a semiconductor substrate (wafer). In the NTD, a bright field mask (transfer mask having a high pattern aperture) is frequently used. In a bright-field phase shift mask, a balance between zeroth-order light and first-order light of light transmitted through a light-transmitting portion is improved by making the phase shift film have a transmittance of 10% or more with respect to exposure light. When the above-mentioned balance is improved, an effect of attenuating a light intensity due to an interference by the exposure light transmitted through the phase shift film against the zeroth-order light is further increased so that pattern resolution on the resist film is improved. Accordingly, the transmittance of the phase shift film 2 with respect to the ArF exposure light is preferably 10% or more. In case where the transmittance with respect to the ArF exposure light is 15% or more, a pattern edge enhancement effect of a transfer image (projected optical image) by a phase shift effect is further improved. On the other hand, the transmittance of the phase shift film 2 exceeding 40% with respect to the ArF exposure light is not preferable because the effect of a side lobe becomes excessively strong.

In order to obtain an appropriate phase shift effect, the phase shift film 2 is required to have a function of producing a predetermined phase difference between the ArF exposure light transmitted therethrough and light transmitted through air for a same distance as the thickness of the phase shift film 2. The phase difference is preferably adjusted to fall within a range of 150 degrees or more and 200 degrees or less. The lower limit of the phase difference in the phase shift film 2 is preferably 160 degrees or more, more preferably 170 degrees or more. On the other hand, the upper limit of the phase difference in the phase shift film 2 is more preferably 190 degrees or less.

The phase shift film 2 preferably has a thickness of 90 nm or less, more preferably 80 nm or less. On the other hand, the phase shift film 2 preferably has a thickness of 40 nm or more. If the thickness of the phase shift film 2 is smaller than 40 nm, a predetermined transmittance and a predetermined phase difference required as the phase shift film might not be obtained.

The phase shift film 2 is a layered film having two or more layers at least comprising a nitrogen-containing layer (silicon nitride-based material layer) and an oxygen-containing layer (silicon oxide-based material layer). The phase shift film 2 essentially has to comprise at least one nitrogen-containing layer and at least one oxygen-containing layer and may further comprise one or more nitrogen-containing layers and one or more oxygen-containing layers. For example, the phase shift film 2 may have a structure comprising two or more layered structures each of which comprises a nitrogen-containing layer and an oxygen-containing layer (layered structure of four or more layers), or may have a structure comprising an oxygen-containing layer between two nitrogen-containing layers. The phase shift film 2 may have any material layer(s) other than the nitrogen-containing layer and the oxygen-containing layer as far as the effect of this disclosure is obtained.

The nitrogen-containing layer is preferably formed of a material consisting of silicon and nitrogen, or a material consisting of nitrogen, silicon, and one or more elements selected from non-metal elements and metalloid elements. The nitrogen-containing layer may contain any metalloid element(s). Among the metalloid elements, one or more elements selected from boron, germanium, antimony, and tellurium are preferably contained because an increase in conductivity of silicon used as a sputtering target is expected.

The nitrogen-containing layer may contain any non-metal element(s). The non-metal elements in this case include narrow-sense non-metal elements (nitrogen, carbon, oxygen, phosphorus, sulfur, and selenium), halogens, and noble gases. Among the non-metal elements, one or more elements selected from carbon, fluorine, and hydrogen are preferably contained. The nitrogen-containing layer preferably has an oxygen content of 10 atomic % or less, more preferably 5 atomic % or less, further preferably do not positively contain oxygen (not higher than a detection lower limit when composition analysis is carried out by the X-ray photoelectron spectroscopy or the like). If the oxygen content of the nitrogen-containing layer is large, a difference in optical characteristics from the oxygen-containing layer becomes small and the degree of freedom in designing the phase shift film is reduced.

The nitrogen-containing layer may contain a noble gas. The noble gas is an element which is capable of increasing a film-forming rate and improving productivity by presence in a film-forming chamber upon forming the nitrogen-containing layer by reactive sputtering. The noble gas is converted into plasma to collide with a target so that target constituent elements are ejected from the target and, while introducing a reactive gas in the middle, the nitrogen-containing layer is formed on the transparent substrate 1. During a period after the target constituent elements are ejected from the target and before they are adhered to the transparent substrate 1, the noble gas in the film-forming chamber is slightly introduced. Preferable elements as the noble gas required in the reactive sputtering may be argon, krypton, and xenon. In order to relax stress in the nitrogen-containing layer, helium and neon, which are small in atomic weight, may positively be introduced.

The nitrogen-containing layer preferably has a nitrogen content of 50 atomic % or more. In a silicon-based film, a refractive index n with respect to the ArF exposure light is very small and an extinction coefficient k with respect to the ArF exposure light is large. Hereinafter, the refractive index n as a simple expression refers to the refractive index n with respect to the ArF exposure light. The extinction coefficient k as a simple expression refers to the refractive index k with respect to the ArF exposure light. As the nitrogen content in the silicon-based film is increased, the refractive index n tends to be larger and the extinction coefficient k tends to be smaller. Taking into account that the predetermined transmittance required to the phase shift film 2 is assured while the phase difference is assured with a smaller thickness, the nitrogen content in the nitrogen-containing layer is preferably 50 atomic % or more, more preferably 51 atomic % or more, further preferably 52 atomic % or more. The nitrogen content in the nitrogen-containing layer is preferably 57 atomic % or less, more preferably 56 atomic % or less. If the nitrogen-containing layer contains nitrogen at a mixing ratio greater than that in $Si_3N_4$, it is difficult to form the nitrogen-containing layer into an amorphous or a microcrystalline structure. In addition, surface roughness of the nitrogen-containing layer is seriously degraded.

The nitrogen-containing layer preferably has a silicon content of 35 atomic % or more, more preferably 40 atomic % or more, further preferably 45 atomic % or more.

The nitrogen-containing layer is preferably formed of a material consisting of silicon and nitrogen. In this case, it may be recognized that the material consisting of silicon and nitrogen encompasses a material containing a noble gas.

When the nitrogen-containing layer is subjected to the X-ray photoelectron spectroscopy to acquire the maximum peak PSi_f of photoelectron intensity of an Si2p narrow spectrum in the nitrogen-containing layer and the transparent substrate 1 is subjected to the X-ray photoelectron spectroscopy to acquire the maximum peak PSi_s of photoelectron intensity of an Si2p narrow spectrum in the transparent substrate 1, a numerical value (PSi_f)/(PSi_s) is preferably 1.09 or less where the numerical value is obtained by dividing the maximum peak PSi_f in the nitrogen-containing layer by the maximum peak PSi_s in the transparent substrate 1. As described above, the nitrogen-containing layer with the numerical value (PSi_f)/(PSi_s) of 1.09 or less is difficult to be excited in response to irradiation with the ArF exposure light. By forming such nitrogen-containing layer, it is possible to increase the ArF lightfastness. As described above, the nitrogen-containing layer has a high abundance ratio of nitrogen-silicon bonds in a strong bonding condition. By forming such nitrogen-containing layer, it is possible to improve chemical resistance. The numerical value (PSi_f)/(PSi_s) is preferably 1.085 or less, more preferably 1.08 or less.

On the other hand, in case of dry etching with a fluorine-based gas, such as $SF_6$, which is carried out in patterning the phase shift film 2, the nitrogen-containing layer is high in etching rate as compared with the oxygen-containing layer. Therefore, when the phase shift film 2 is patterned by dry etching, unevenness tends to easily occur on a side wall of a pattern.

In case where the nitrogen-containing layer is patterned by the dry etching using the fluorine-based gas, fluorine atoms in an excited state break the nitrogen-silicon bonds to produce and volatilize silicon fluoride having a relatively low boiling point so that a pattern is formed on the nitrogen-containing layer. Since the nitrogen-silicon bonds are hardly broken in the nitrogen-containing layer having the numerical value (PSi_f)/(PSi_s) of 1.09 or less, it is said that the etching rate of the dry etching with respect to the fluorine-based gas is reduced. Thus, a difference in etching rate between the nitrogen-containing layer and the oxygen-containing layer of the phase shift film 2 becomes small so as to reduce the unevenness of the side wall of the pattern formed on the phase shift film 2 by dry etching.

On the other hand, as a technique of repairing a mask defect in the halftone phase shift mask, use may be made of a defect repairing technique of etching and removing a black defect portion of the phase shift film by irradiating the black defect portion with an electron beam while supplying a xenon difluoride ($XeF_2$) gas to that portion to convert the black defect portion into volatile fluoride. Hereinafter, such defect repair carried out by irradiation with charged particles such as the electron beam will simply be called EB defect repair. In case where the EB defect repair is carried out on the phase shift film 2 after the transfer pattern is formed, a repair rate of the nitrogen-containing layer tends to be high as compared with that of the oxygen-containing layer. In addition, in case of the EB defect repair, etching is performed on the pattern of the phase shift film 2 in a state where the side wall is exposed. Therefore, side etching, which is etching progressing in a side wall direction of the pattern, easily enters particularly into the nitrogen-containing layer. Accordingly, a pattern shape after the EB defect repair tends to be an uneven shape with unevenness formed between the nitrogen-containing layer and the oxygen-containing layer.

The $XeF_2$ gas used in the EB defect repair is known as an etching gas in an unexcited state when the silicon-based material is subjected to isotropic etching. The above-mentioned etching is performed by a process including surface adsorption of the $XeF_2$ gas in the unexcited state to the silicon-based material, separation into Xe and F, production of high-order silicon fluoride, and volatilization. In the EB defect repair for a thin film pattern of the silicon-based material, a black defect portion of the thin film pattern is supplied with a fluorine-based gas in the unexcited state, such as $XeF_2$ gas. The fluorine-based gas is adsorbed to a surface of the black defect portion and then the black defect portion is irradiated with the electron beam. Consequently, silicon atoms in the black defect portion are excited and forming a bond with fluorine is promoted so that high-order silicon fluoride is produced and volatilized at a considerably higher speed than that in case of no irradiation with the electron beam. The nitrogen-containing layer which emits a less number of photoelectrons and is hardly excited when it is irradiated with the X-rays is said to be a material which is hardly excited also in response to irradiation with the electron beam.

The nitrogen-containing layer having the above-mentioned numerical value (PSi_f)/(PSi_s) of 1.09 or less is hardly excited in response to the irradiation with the electron beam so that a repair rate can be decreased when the EB defect repair is carried out. Thus, a difference in repair rate in the EB defect repair between the nitrogen-containing layer and the oxygen-containing layer of the phase shift film 2 becomes small so as to decrease the unevenness of the side wall of the pattern at a position where the EB defect repair of the phase shift film 2 is carried out.

In the X-ray photoelectron spectroscopy mentioned above, either AlKα rays or MgKα rays are applicable as the X-rays for irradiation to the transparent substrate 1 and the nitrogen-containing layer of the phase shift film 2 but the AlKα rays are preferably used. In the present specification, description is made about the case where the X-ray photoelectron spectroscopy is carried out by using the AlKα rays as the X-rays.

A method of acquiring an Si2p narrow spectrum by carrying out the X-ray photoelectron spectroscopy on the transparent substrate 1 and the nitrogen-containing layer is generally carried out through the following steps. Specifically, wide scanning for acquiring photoelectron intensity (the number of emitted photoelectrons per unit time from a measured object irradiated with the X-rays) in a wide bandwidth of a bond energy is at first carried out to acquire a wide spectrum and all peaks derived from constituent elements of the transparent substrate 1 and the nitrogen-containing layer are identified. Thereafter, narrow scanning higher in resolution than the wide scanning but narrower in available bandwidth of the bond energy is carried out in a bandwidth around the peak (Si2p) on which attention is focused. On the other hand, for the transparent substrate 1 or the nitrogen-containing layer as the measured object for which the X-ray photoelectron spectroscopy is used in this disclosure, constituent elements are known in advance. In addition, the narrow spectrum required in this disclosure is limited to the Si2p narrow spectrum. Therefore, in this disclosure, the Si2p narrow spectrum may be obtained without performing the process of acquiring the wide spectrum.

The maximum peak (PSi_s, PSi_f) of photoelectron intensity in the Si2p narrow spectrum obtained by carrying out the X-ray photoelectron spectroscopy on the transparent substrate 1 or the nitrogen-containing layer is preferably the maximum peak at the bond energy in a range of 96 [eV] or more and 106 [eV] or less. This is because those peaks beyond the above-mentioned range of the bond energy may not be photoelectrons emitted from the Si—N bond or the Si—O bonds.

The nitrogen-containing layer preferably has a ratio of 0.88 or more where the ratio is obtained by dividing the number of existing $Si_3N_4$ bonds by the total number of the existing $Si_3N_4$ bonds, existing $Si_aN_b$ bonds (where b/[a+b] <4/7), Si—Si bonds, Si—O bonds, and Si—ON bonds. The nitrogen-containing layer with a high abundance ratio of stable bonds is high in ArF lightfastness and chemical resistance. Among the above-mentioned bonds, the Si—O bonds are most stable. However, from the above-mentioned limitation, it is difficult to make the nitrogen-containing layer contain a large amount of oxygen. Among the bonds of silicon and other elements except oxygen, $Si_3N_4$ bonds are most stable. The above-mentioned nitrogen-containing layer having a high abundance ratio of the $Si_3N_4$ bonds is high in ArF lightfastness and chemical resistance.

The total film thickness of all of the nitrogen-containing layers in the phase shift film 2 is preferably 30 nm or more. If the total film thickness of all of the nitrogen-containing layers is smaller than 30 nm, a predetermined transmittance (40% or less) and a predetermined phase difference (150 degrees or more and 200 degrees or less) required as the phase shift film may not be obtained. The total film thickness of all of the nitrogen-containing layers is more preferably 35 nm or more, further preferably 40 nm or more. On the other hand, the total film thickness of all of the nitrogen-containing layers in the phase shift film 2 is preferably 60 nm or less, more preferably 55 nm or less.

The oxygen-containing layer is preferably formed of a material consisting of silicon and oxygen or a material consisting of oxygen, silicon, and one or more elements selected from metalloid elements and non-metal elements. The oxygen-containing layer may contain any metalloid elements. Among the metalloid elements, one or more elements selected from boron, germanium, antimony, and tellurium are preferably contained because an increase in conductivity of silicon used as a sputtering target is expected.

The oxygen-containing layer may contain any non-metal elements. The non-metal elements in this case include narrow-sense non-metal elements (nitrogen, carbon, oxygen, phosphorus, sulfur, and selenium), halogens, and noble gases. Among the non-metal elements, one or more elements selected from carbon, fluorine, and hydrogen are preferably contained. From the similar reason to that in case of the nitrogen-containing layer, the oxygen-containing layer may contain a noble gas.

In the oxygen-containing layer, the total content of nitrogen and oxygen is preferably 50 atomic % or more. Taking into account increasing the degree of freedom in designing the phase shift film 2 (in particular, transmittance), the total content of nitrogen and oxygen in the oxygen-containing layer is preferably 50 atomic % or more, more preferably 55 atomic % or more, further preferably 60 atomic % or more. The total content of nitrogen and oxygen in the oxygen-containing layer is preferably 66 atomic % or less. If the oxygen-containing layer contains nitrogen and oxygen at a mixing ratio greater than that in $SiO_2$ and $Si_3N_4$, it is difficult to form the oxygen-containing layer into an amorphous or a microcrystalline structure. In addition, surface roughness of the oxygen-containing layer is seriously degraded.

The oxygen-containing layer is preferably formed of a material consisting of silicon, nitrogen, and oxygen. In particular, in case where the degree of freedom in designing the phase shift film is widened in a high-transmittance region, the oxygen-containing layer may be formed of a material consisting of silicon and oxygen. In this case, it may be recognized that the material consisting of silicon, nitrogen, and oxygen or the material consisting of silicon and oxygen encompasses a material containing a noble gas.

The oxygen-containing layer preferably has an oxygen content of 15 atomic % or more. In the silicon-based film, as the oxygen content is greater, an extinction coefficient k is considerably decreased as compared with the case where the nitrogen content is increased. In case where the degree of freedom in designing the phase shift film is widened in the high-transmittance region, the oxygen content in the oxygen-containing layer is preferably 15 atomic % or more, more preferably 20 atomic % or more, further preferably 25 atomic % or more.

The total film thickness of all of the oxygen-containing layers in the phase shift film 2 is preferably 10 nm or more, more preferably 15 nm or more, further preferably 20 nm or more. On the other hand, the total film thickness of all of the oxygen-containing layers in the phase shift film 2 is preferably 50 nm or less, more preferably 45 nm or less.

The nitrogen-containing layer and the oxygen-containing layer most preferably have the amorphous structure because pattern edge roughness is excellent when the pattern is formed by etching. In case where the nitrogen-containing layer or the oxygen-containing layer has a composition difficult to form the amorphous structure, a state where the amorphous structure and the microcrystalline structure are mixed is preferable.

The nitrogen-containing layer preferably has a refractive index n of 2.3 or more, more preferably 2.4 or more. The nitrogen-containing layer preferably has an extinction coefficient k of 0.5 or less, more preferably 0.4 or less. On the other hand, the nitrogen-containing layer preferably has a refractive index n of 3.0 or less, more preferably 2.8 or less. The nitrogen-containing layer preferably has an extinction coefficient k of 0.16 or more, more preferably 0.2 or more.

The oxygen-containing layer preferably has a refractive index n of 1.5 or more, more preferably 1.8 or more. The oxygen-containing layer preferably has an extinction coefficient k of 0.15 or less, more preferably 0.1 or less. On the other hand, the oxygen-containing layer preferably has a refractive index n of 2.2 or less, more preferably 1.9 or less. The oxygen-containing layer preferably has an extinction coefficient k of 0 or more.

A refractive index n and an extinction coefficient k of a thin film is not determined only by a composition of the thin film. A film density and a crystalline state of the thin film are also factors affecting the refractive index n and the extinction coefficient k. Therefore, by adjusting various conditions upon forming the thin film by reactive sputtering, the thin film is formed so that the thin film has a desired refractive index n and a desired extinction coefficient k. In order to make each of the nitrogen-containing layer and the oxygen-containing layer have the refractive index n and the extinction coefficient k in desired ranges, not only the ratio of a mixture of the noble gas and a reactive gas is adjusted upon forming the thin film by reactive sputtering. There are a wide variety of conditions such as a pressure in the film-forming chamber during formation of the thin film by reactive sputtering, an electric power applied to the target, and a positional relationship such as a distance between the target and the transparent substrate. These film-forming conditions are specific to a film-forming apparatus and are appropriately adjusted so that the thin film to be formed has the desired refractive index n and the desired extinction coefficient k.

The nitrogen-containing layer and the oxygen-containing layer are formed by sputtering. Any sputtering such as DC sputtering, RF sputtering, and ion beam sputtering may be applicable. In case where a target low in conductivity (silicon target, silicon compound target containing no or a small content of metalloid element, and so on) is used, it is preferable to apply the RF sputtering or the ion beam sputtering. Taking a film-forming rate into consideration, it is more preferable to apply the RF sputtering.

If the phase shift film 2 has large film stress, there arises a problem that, when the phase shift mask is manufactured from the mask blank, displacement of the transfer pattern formed on the phase shift film 2 is increased. The film stress of the phase shift film 2 is preferably 275 MPa or less, more preferably 165 MPa or less, further preferably 110 MPa or less. The phase shift film 2 formed by the above-mentioned sputtering has relatively large film stress. Therefore, the phase shift film 2 after it is formed by sputtering is preferably subjected to heating treatment or light irradiation treatment by a flash lamp or the like so as to reduce the film stress of the phase shift film 2.

Figure 2A:
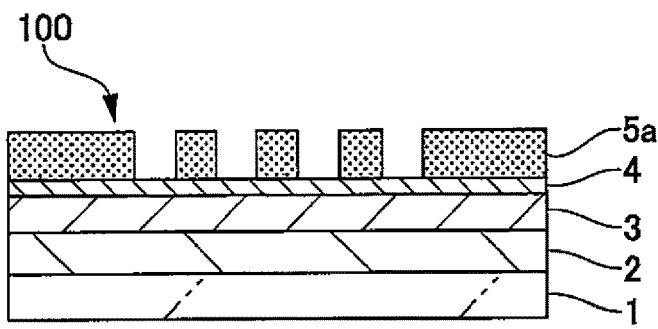
FIGS. 2A to 2F are sectional views for illustrating a manufacturing process of a phase shift mask in the embodiment of this disclosure.
Figure 2B:
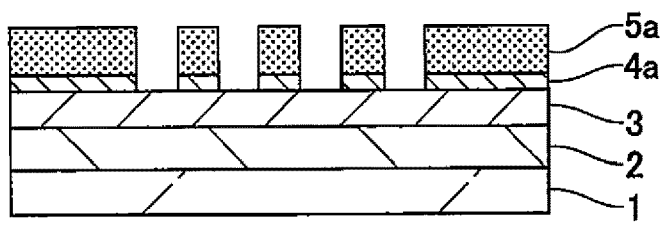

The mask blank 100 preferably has the light shielding film 3 on the phase shift film 2. Generally, in a phase shift mask 200 (see FIG. 2F), an outer peripheral region outside an area where the transfer pattern is to be formed (transfer pattern forming area) is required to secure an optical density (OD) of a predetermined value or more so that, when exposure transfer is carried out onto a resist film on a semiconductor wafer by using an exposure apparatus, the resist film is not affected by exposure light transmitted through the outer peripheral region. The outer peripheral region of the phase shift mask 200 is at least required to have an optical density greater than 2.0. As described above, the phase shift film 2 has a function of transmitting the exposure light at a predetermined transmittance and the above-mentioned optical density is difficult to be secured only by the phase shift film 2. Therefore, in a stage of manufacturing the mask blank 100, it is desired that the light shielding film 3 is formed as a layer on the phase shift film 2 in order to supplement the insufficient optical density. With the mask blank 100 having the above-mentioned configuration, it is possible to manufacture the phase shift mask 200 with the above-mentioned optical density secured in the outer peripheral region if the light shielding film 3 in an area where the phase shift effect is used (basically, the transfer pattern forming area) is removed in the middle of manufacturing the phase shift mask 200. The mask blank 100 preferably has an optical density of 2.5 or more in the layered structure of the phase shift film 2 and the light shielding film 3, more preferably 2.8 or more. In order to reduce the film thickness of the light shielding film 3, the optical density in the layered structure of the phase shift film 2 and the light shielding film 3 is preferably 4.0 or less.

For the light shielding film 3, both of a single-layer structure and a layered structure of two or more layers are applicable. The light shielding film 3 of the single-layer structure and each layer of the light shielding film 3 having the layered structure of two or more layers may have a configuration that a composition is substantially same in a thickness direction of the film or the layer or a configuration with composition gradient in the thickness direction of the layer.

For the light shielding film 3, a material having a sufficient etching selectivity for the etching gas used upon forming the pattern on the phase shift film 2 must be applied in case where no other film is interposed between the light shielding film and the phase shift film 2. In this case, the light shielding film 3 is preferably formed of a material containing chromium. The material which forms the light shielding film 3 and which contains chromium may be chromium metal or a material containing chromium and one or more elements selected from oxygen, nitrogen, carbon, boron, and fluorine.

Generally, a chromium-based material is etched by a mixture of a chlorine-based gas and an oxygen gas. However, the chromium metal is not so high in etching rate for such etching gas. Taking into account increasing the etching rate for the etching gas which is the mixture of the chlorine-based gas and the oxygen gas, a material containing chromium and one or more elements selected from oxygen, nitrogen, carbon, boron, and fluorine is preferably used as the material forming the light shielding film 3. The material which forms the light shielding film 3 and which contains chromium may further contain one or more elements selected from molybdenum and tin. By containing one or more elements selected from molybdenum and tin in the material containing chromium, it is possible to increase the etching rate for the mixture of the chlorine-based gas and the oxygen gas.

On the other hand, in case where another film is interposed between the light shielding film 3 and the phase shift film 2 in the mask blank 100, the above-mentioned another film (etching stopper and etching mask film) is formed of the above-mentioned material containing chromium whereas the light shielding film 3 is formed of the material containing silicon. The material containing chromium is etched by the mixture of the chlorine-based gas and the oxygen gas whereas the resist film formed of an organic material is easily etched by the mixture. The material containing silicon is generally etched by a fluorine-based gas or a chlorine-based gas. Basically, these etching gases do not contain oxygen and, accordingly, an amount of reduction of the resist film of the organic material can be decreased as compared with the case where etching is carried out using the mixture of the chlorine-based gas and the oxygen gas. Therefore, the film thickness of the resist film can be reduced.

The material containing silicon and forming the light shielding film 3 may contain a transition metal or may contain a metal element other than the transition metal. The reason is as follows. In case where the phase shift mask 200 is manufactured from the mask blank 100, a pattern formed by the light shielding film 3 is basically a light shielding zone pattern in the outer peripheral region and is irradiated with the ArF exposure light in a less cumulative amount as compared with a transfer pattern forming region. In addition, the light shielding film 3 rarely remains in a fine pattern and any substantial problem is unlikely to occur even if ArF lightfastness is low. When the light shielding film 3 contains a transition metal, a light shielding performance is considerably improved as compared with the case where no transition metal is contained. It is therefore possible to reduce the thickness of the light shielding film. The transition metal contained in the light shielding film 3 may be any one metal selected from molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd) or a compound of these metals.

On the other hand, as the material containing silicon and forming the light shielding film 3, a material consisting of silicon and nitrogen or a material containing one or more element selected from metalloid elements and non-metal elements in addition to the material consisting of silicon and nitrogen may be applied.

The above-mentioned mask blank 100 comprising the light shielding film 3 formed as a layer on the phase shift film 2 preferably has a structure in which a hard mask film 4 formed of a material having an etching selectivity for the etching gas used in etching the light shielding film 3 is further formed as a layer on the light shielding film 3. Since the light shielding film 3 requires a function of securing a predetermined optical density, there is a limit in reducing the thickness thereof. It is sufficient that the hard mask film 4 has a film thickness allowing the hard mask film to function as an etching mask until completion of dry etching to form a pattern on the light shielding film 3 directly thereunder. Basically, no optical limitation is imposed on the hard mask film. Therefore, the thickness of the hard mask film 4 can be considerably reduced as compared with the thickness of the light shielding film 3. It is sufficient that the resist film of the organic material has a film thickness allowing the resist film to function as an etching mask until completion of dry etching to form a pattern on the hard mask film 4. Therefore, the thickness of the resist film can considerably be reduced than in the past.

In case where the light shielding film 3 is formed of the material containing chromium, the hard mask film 4 is preferably formed of the above-mentioned material containing silicon. The hard mask film 4 in this case tends to be low in adhesion with the resist film of the organic material. Therefore, it is preferable to perform HMDS (Hexamethyldisilazane) treatment on a surface of the hard mask film 4 so as to improve the adhesion of the surface. More preferably, the hard mask film 4 in this case is formed of $SiO_2$, SiN, SiON, or the like. As a material of the hard mask film 4 in case where the light shielding film 3 is formed of the material containing chromium, a material containing tantalum is applicable in addition to the above-mentioned materials. The material containing tantalum in this case may be tantalum metal or a material containing tantalum and one or more elements selected from nitrogen, oxygen, boron, and carbon. For example, the material may be Ta, TaN, TaON, TaBN, TaBON, TaCN, TaCON, TaBCN, or TaBOCN. On the other hand, when the light shielding film 3 is formed of the material containing silicon, the hard mask film 4 is preferably formed of the above-mentioned material containing chromium.

In the mask blank 100, the resist film of the organic material is preferably formed in contact with the surface of the hard mask film 4 to a film thickness of 100 nm or less. In case of a fine pattern corresponding to the DRAM of hp 32 nm generation, the transfer pattern (phase shift pattern) to be formed on the hard mask film 4 is sometimes provided with SRAF (Sub-Resolution Assist Feature) having a line width of 40 nm. Even in this event, however, a cross-section aspect ratio of the resist pattern can be lowered to 1:2.5. Therefore, it is possible to prevent the resist pattern from being collapsed or detached during development or rinsing of the resist film. More preferably, the resist film has a film thickness of 80 nm or less.

In FIGS. 2A to 2F, a process of manufacturing the phase shift mask 200 from the mask blank 100 according to the embodiment of this disclosure is illustrated in schematic sectional views.

The phase shift mask 200 according to this disclosure comprises the transparent substrate 1 and the phase shift film 2 formed thereon and provided with the transfer pattern (phase shift pattern 2a). The phase shift mask 200 is characterized in that the phase shift film 2 (phase shift pattern 2a) at least contains a nitrogen-containing layer and an oxygen-containing layer; that the oxygen-containing layer is formed of a material consisting of silicon and oxygen, or a material consisting of oxygen, silicon, and one or more elements selected from metalloid elements and non-metal elements; that the nitrogen-containing layer is formed of a material consisting of silicon and nitrogen, or a material consisting of silicon, nitrogen, and one or more elements selected from non-metal elements and metalloid elements, and that, when the nitrogen-containing layer is subjected to the X-ray photoelectron spectroscopy to obtain the maximum peak PSi_f of photoelectron intensity of an Si2p narrow spectrum in the nitrogen-containing layer and the transparent substrate 1 is subjected to the X-ray photoelectron spectroscopy to obtain the maximum peak PSi_s of photoelectron intensity of an Si2p narrow spectrum in the transparent substrate 1, a numerical value (PSi_f)/(PSi_s) is 1.09 or less where the numerical value is obtained by dividing the maximum peak PSi_f in the nitrogen containing layer by the maximum peak PSi_s in the transparent substrate.

The phase shift mask 200 is similar in technical characteristics to the mask blank 100. The matters regarding the transparent substrate 1, the phase shift film 2, and the light shielding film 3 (light shielding pattern) in the phase shift mask 200 are similar to those in the mask blank 100. The phase shift mask 200 mentioned above is improved in ArF lightfastness of the entire phase shift film 2 (phase shift pattern 2a) and also improved in chemical resistance. Therefore, when the phase shift mask 200 is set on a mask stage of an exposure apparatus with an ArF excimer laser used as exposure light and the phase shift pattern 2a is exposure-transferred to a resist film on a semiconductor substrate, it is possible to transfer the pattern to the resist film on the semiconductor substrate with an accuracy sufficiently satisfying a design specification.

Hereinafter, according to a manufacturing process illustrated in FIGS. 2A to 2F, one example of a method for manufacturing the phase shift mask 200 will be described. In this example, the material containing chromium is used as the light shielding film 3 whereas the material containing silicon is used as the hard mask film 4.

At first, the resist film was formed by spin coating in contact with the hard mask film 4 in the mask blank 100. Next, on the resist film, a first pattern as a transfer pattern (phase shift pattern) to be formed on the phase shift film 2 was written by exposure. Furthermore, a predetermined process such as development was carried out to form a first resist pattern 5a having the phase shift pattern (see FIG. 2A). Subsequently, with the first resist pattern 5a used as a mask, dry etching using a fluorine-based gas was carried out to form a first pattern (hard mask pattern 4a) on the hard mask film 4 (see FIG. 2B).

Figure 2C:
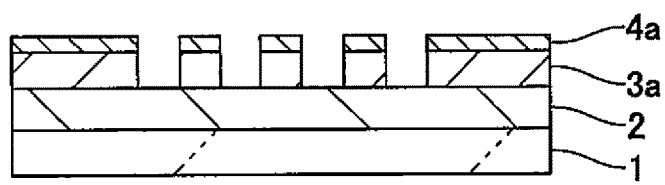

Next, after removing the resist pattern 5a, dry etching using a mixture of a chlorine-based gas and an oxygen gas was carried out with the hard mask pattern 4a used as a mask, to form a first pattern (light shielding pattern 3a) on the light shielding film 3 (see FIG. 2C). Subsequently, with the light shielding pattern 3a used as a mask, dry etching using a fluorine-based gas was carried out to form the first pattern (phase shift pattern 2a) on the phase shift film 2 and simultaneously remove the hard mask pattern 4a (see FIG. 2D).

Next, the resist film was formed on the mask blank 100 by spin coating. Next, a second pattern as a pattern to be formed on the light shielding film 3 (light shielding pattern) was written by exposure on the resist film. Furthermore, a predetermined process such as development was carried out to form a second resist pattern 6b having the light shielding pattern. Subsequently, with the second resist pattern 6b used as a mask, dry etching using a mixture of a chlorine-based gas and an oxygen gas was carried out to form the second pattern (light shielding pattern 3b) on the light shielding film 3 (see FIG. 2E). Furthermore, the second resist pattern 6b was removed. Through a predetermined process such as cleaning, the phase shift mask 200 was obtained (see FIG. 2F).

The chlorine-based gas used in the dry etching mentioned above is not particularly limited as far as Cl is contained. For example, the chlorine-based gas may be $Cl_2$, $SiCl_2$, $CHCl_3$, $CH_2Cl_2$, $CCl_4$, $BCl_3$, and so on. The fluorine-based gas used in the dry etching mentioned above is not particularly limited as far as F is contained. For example, the fluorine-based gas may be $CHF_3$, $CF_4$, $C_2F_6$, $C_4F_8$, $SF_6$, and so on. In particular, since the fluorine-based gas free from C is relatively low in etching rate for the transparent substrate 1 of a glass material, a damage against the transparent substrate 1 can further be reduced.

Furthermore, a method for manufacturing a semiconductor device according to this disclosure is characterized in that the pattern is exposure-transferred to the resist film on the semiconductor substrate using the phase shift mask 200 manufactured using the mask blank 100 mentioned above. The mask blank 100 according to this disclosure and the phase shift mask 200 manufactured using the mask blank 100 have the effect as mentioned above. Therefore, when the phase shift mask 200 is set on the mask stage of the exposure apparatus with the ArF excimer laser used as the exposure light and the phase shift pattern 2a is exposure-transferred to the resist film on the semiconductor substrate, it is possible to transfer the pattern onto the resist film on the semiconductor substrate with an accuracy sufficiently satisfying the design specification.

On the other hand, as another embodiment related to this disclosure, a mask blank having the following configuration is given. Specifically, the mask blank according to another embodiment comprises a transparent substrate and a phase shift film formed thereon and is characterized in that the phase shift film is a single-layer film having a composition gradient portion which is formed on its surface on the side opposite from the transparent substrate and in a region adjacent thereto and which is increased in oxygen content; that the phase shift film is formed of a material consisting of silicon and nitrogen, or a material consisting of nitrogen, silicon, and one or more elements selected from non-metal elements and metalloid elements; and that, when the phase shift film is subjected to the X-ray photoelectron spectroscopy to obtain the maximum peak PSi_f of photoelectron intensity of an Si2p narrow spectrum in the phase shift film and the transparent substrate is subjected to the X-ray photoelectron spectroscopy to obtain the maximum peak PSi_s of photoelectron intensity of an Si2p narrow spectrum in the transparent substrate, a numerical value (PSi_f)/(PSi_s) is 1.09 or less where the numerical value is obtained by dividing the maximum peak PSi_f in the phase shift film by the maximum peak PSi_s in the transparent substrate.

A region of the phase shift film except the composition gradient portion has characteristics similar to those of the nitrogen-containing layer of the phase shift mask according to this disclosure. The composition gradient portion of the phase shift film is high in both ArF lightfastness and chemical resistance because the oxygen content is large. Therefore, as compared with an existing mask blank having a single-layer structure and formed of a silicon nitride-based material, the mask blank according to another embodiment is high in ArF lightfastness of the entire phase shift film and also in chemical resistance. Other matters regarding the phase shift film of another embodiment are similar to those of the nitrogen-containing layer in the phase shift film according to the embodiment of this disclosure.

Furthermore, a phase shift mask according to another embodiment, similar in characteristics to the mask blank of another embodiment mentioned above, may be given. Specifically, the phase shift mask according to another embodiment comprises a transparent substrate and a phase shift film formed thereon and provided with a transfer pattern and is characterized in that the phase shift film is a single-layer film having a composition gradient portion which is formed on its surface on the side opposite from the transparent substrate and in a region adjacent thereto and which is increased in oxygen content; that the phase shift film is formed of a material consisting of silicon and nitrogen or a material consisting of nitrogen, silicon, and one or more elements selected from non-metal elements and metalloid elements, and that, when the phase shift film is subjected to the X-ray photoelectron spectroscopy to obtain the maximum peak PSi_f of photoelectron intensity of an Si2p narrow spectrum in the phase shift film and the transparent substrate is subjected to the X-ray photoelectron spectroscopy to obtain the maximum peak PSi_s of photoelectron intensity of an Si2p narrow spectrum in the transparent substrate, a numerical value (PSi_f)/(PSi_s) is 1.09 or less where the numerical value is obtained by dividing the maximum peak PSi_f in the phase shift film by the maximum peak PSi_s in the transparent substrate.

Like in case of the mask blank according to another embodiment mentioned above, the phase shift mask of another embodiment is high in ArF lightfastness of the entire phase shift film and in chemical resistance as compared with an existing phase shift mask comprising a phase shift film having a single layer structure and formed of a silicon nitride-based material. When the phase shift mask of this embodiment is set on the mask stage of the exposure apparatus with the ArF excimer laser used as the exposure light and the phase shift pattern is exposure-transferred to the resist film on the semiconductor substrate, it is possible to transfer the pattern to the resist film on the semiconductor substrate with an accuracy sufficiently satisfying the design specification.

EXAMPLES

Hereinafter, the embodiments of this disclosure will more specifically be described with reference to examples.

Example 1

[Manufacture of Mask Blank]

A transparent substrate 1 made of synthetic quartz glass with a main surface having a size of about 152 mm×about 152 mm and a thickness of about 6.25 mm was prepared. In the transparent substrate 1, an end face and the main surface were polished to a predetermined surface roughness. Thereafter, the transparent substrate was subjected to predetermined cleaning and predetermined drying.

Next, on the transparent substrate 1, a phase shift film 2 having a two-layer structure comprising a nitrogen-containing layer and an oxygen-containing layer was formed through the following steps. At first, the transparent substrate 1 was placed in a single-wafer DC sputtering apparatus and, using a silicon (Si) target and a mixture of krypton (Kr), helium (He), and nitrogen ($N_2$) as a sputtering gas, reactive sputtering (RF sputtering) by an RF power supply was carried out to form, on the transparent substrate 1, the nitrogen-containing layer (silicon nitride layer), consisting of silicon and nitrogen, of the phase shift film 2 to a thickness of 58 nm.

Next, the transparent substrate 1 provided with the nitrogen-containing layer was placed in the single-wafer DC sputtering apparatus. Using a silicon dioxide ($SiO_2$) target and an argon (Ar) gas as a sputtering gas, reactive sputtering (RF sputtering) by the RF power supply was carried out to form, on the nitrogen-containing layer, an oxygen-containing layer (silicon oxide layer), consisting of silicon and oxygen, of the phase shift film 2 to a thickness of 11 nm.

Next, the transparent substrate 1 provided with the phase shift film 2 was placed in an electric furnace and subjected to heat treatment in air under conditions of a heating temperature of 550° C. and a treatment time of 1 hour. The electric furnace similar in structure to a vertical furnace disclosed in FIG. 5 of JP 2002-162726 A was used. The heat treatment in the electric furnace was carried out in a state where air passing through a chemical filter was introduced into the furnace. After the heat treatment in the electric furnace, a refrigerant was introduced into the electric furnace to carry out forced cooling on the substrate to a predetermined temperature (around 250° C.). The forced cooling was performed in a state where a nitrogen gas as the refrigerant was introduced into the furnace (substantially in a nitrogen gas atmosphere). After the forced cooling, the substrate was taken out from the electric furnace and subjected to natural cooling in air down to normal temperature (25° C. or lower)

For the phase shift film 2 after the heat treatment, a transmittance and a phase difference at a wavelength (about 193 nm) of the ArF excimer laser light were measured by a phase shift measurement apparatus (MPM-193 manufactured by Lasertec Corporation). As a result, the transmittance was 21% and the phase difference was 177 degrees.

On a main surface of a transparent substrate newly prepared, a phase shift film was formed in the same conditions as the phase shift film mentioned above. Furthermore, heat treatment was carried out in the same conditions as mentioned above. Thereafter, optical characteristics of the phase shift film were measured using a spectroscopic ellipsometer (M-2000D manufactured by J. A. Woollam Co.). As a result, the nitrogen-containing layer had a refractive index n of 2.56 and an extinction coefficient k of 0.35 at the wavelength of 193 nm whereas the oxygen-containing layer had a refractive index n of 1.59 and an extinction coefficient of 0.00 at the wavelength of 193 nm.

Next, on a main surface of a transparent substrate newly prepared in addition to that mentioned above, a phase shift film was formed in the same film-forming conditions as the phase shift film 2 in Example 1. Furthermore, heat treatment was carried out in the same conditions as mentioned above. Then, the transparent substrate and the phase shift film after the heat treatment were subjected to the X-ray photoelectron spectroscopy. In the X-ray photoelectron spectroscopy, a surface of the phase shift film (or the transparent substrate) was irradiated with the X-rays (AlKα rays: 1486 eV) and the intensity of photoelectrons emitted from the phase shift film (or the transparent substrate) was measured. The surface of the phase shift film (or the transparent substrate) was eroded by Ar gas sputtering for a predetermined time (the depth of about 0.7 nm). The phase shift film (or the transparent substrate) in an eroded region was irradiated with the X-rays and the intensity of photoelectrons emitted from the phase shift film (or the transparent substrate) in the eroded region was measured. By repeating the above-mentioned step, the Si2p narrow spectrum was acquired for each of the phase shift film and the transparent substrate. In the Si2p narrow spectrum thus acquired, because the transparent substrate 1 is an insulator, an energy is displaced downward as compared with a spectrum in case of analysis performed on a conductor. In order to correct the displacement, correction is performed in conformity with a peak of carbon as a conductor. The X-ray photoelectron spectroscopy was carried out using AlKα rays (1486.6 eV) as the X-rays under the conditions that a photoelectron detection region was a circular area with a diameter of 200 μm and a takeoff angle was 45 deg (same in the following comparative example).

Figure 3:
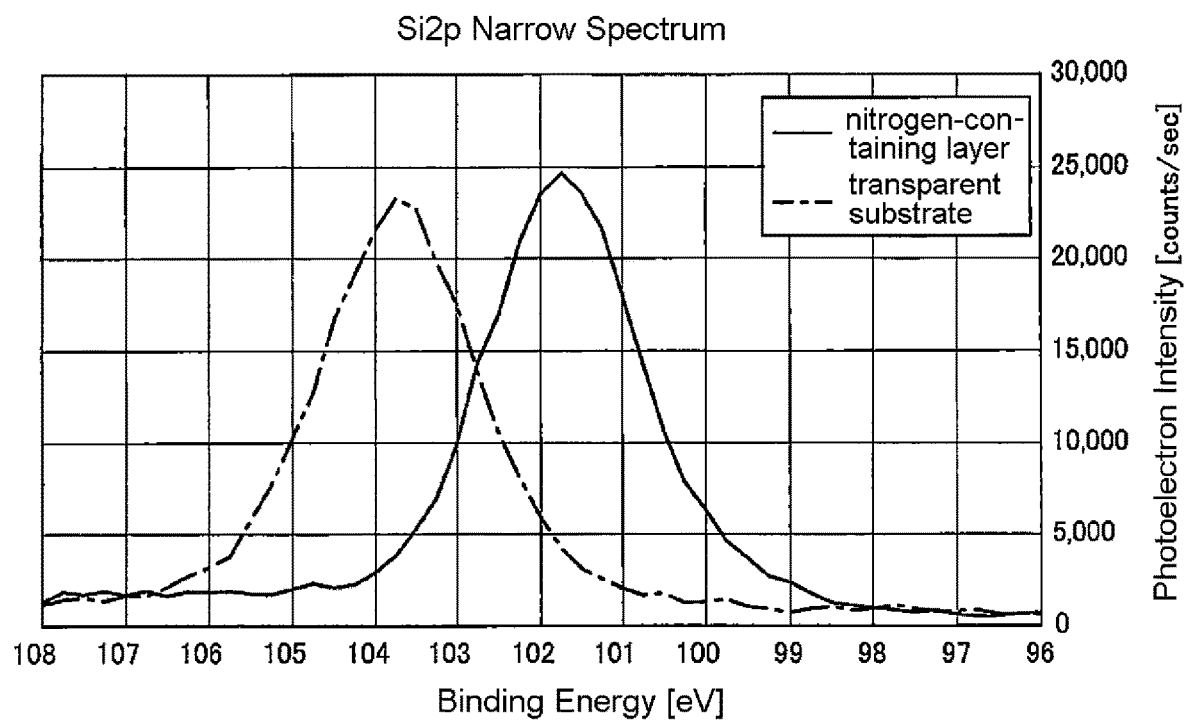
FIG. 3 is a view for illustrating a result (Si2p narrow spectrum) obtained by carrying out X-ray photoelectron spectroscopy on a phase shift film and a transparent substrate of a mask blank according to Example 1 of this disclosure.

In FIG. 3, the Si2P narrow spectrum of each of the nitrogen-containing layer (silicon nitride layer) of the phase shift film and the transparent substrate in Example 1 is illustrated. From the result of the X-ray photoelectron spectroscopy, a value (PSi_f)/(PSi_s) obtained by dividing the maximum peak PSi_f of the Si2p narrow spectrum in the nitrogen-containing layer of the phase shift film by the maximum peak PSi_s of the Si2p narrow spectrum in the transparent substrate was calculated to be equal to 1.077.

The obtained Si2p narrow spectrum of the nitrogen-containing layer includes peaks of $Si_3N_4$ bonds, $Si_aN_b$ bonds (b/[a+b]<4/7), Si—O bonds, and SiON bonds. Fixing a peak position and a full width at half maximum FWHM for each of $Si_3N_4$ bonds, $Si_aN_b$ bonds, Si—O bonds, and SiON bonds (where Si—O bonds and Si—ON bonds have the same peak position), peak resolution was carried out. Specifically, with the peak position of $Si_aN_b$ bonds fixed at 100.4 eV, the peak position of $Si_3N_4$ fixed at 102.0 eV, the peak position of each of Si—O bonds and Si—ON bonds fixed at 103.3 eV, and the full width at half maximum FWHM of those bonds fixed at 2.06, peak resolution was carried out (same in the following Comparative Example 1).

Furthermore, for the spectrum of each of $Si_aN_b$ bonds, $Si_3N_4$ bonds, Si—O bonds, and SiON bonds after peak resolution, an area obtained by subtracting a background calculated by an algorithm of a known technique equipped in an analyzing apparatus was calculated. Based on each area thus calculated, the proportion of existing $Si_aN_b$ bonds, the proportion of existing $Si_3N_4$ bonds, and the proportion of existing Si—O bonds and existing Si—ON bonds were calculated. As a result, the proportion of the existing $Si_aN_b$ bonds was 0.092, the proportion of the existing $Si_3N_4$ bonds was 0.884, and the proportion of the existing Si—O bonds and the existing Si—ON bonds was 0.024. Thus, the nitrogen-containing layer satisfies the condition that the ratio obtained by dividing the number of the existing $Si_3N_4$ bonds by the total number of the existing $Si_3N_4$ bonds, the existing $Si_aN_b$ bonds, the existing Si—O bonds, and the existing Si—ON bonds was 0.88 or more (0.884, satisfactory). From the result of the X-ray photoelectron spectroscopy, it has been found out that the nitrogen-containing layer of the phase shift film had a composition of Si:N:O=43.6 atomic %:55.2 atomic %:1.2 atomic % and that the oxygen-containing layer had a composition of Si:O=33.8 atomic %:66.2 atomic %.

Next, the transparent substrate 1 provided with the phase shift film 2 after heat treatment was placed in the single-wafer DC sputtering apparatus. Using a chromium (Cr) target and a mixture of argon (Ar), carbon dioxide ($CO_2$), and helium (flow rate ratio Ar:$CO_2$:He=18:33:28, pressure=0.15 Pa) as a sputtering gas with an electric power of 1.8 kW from a DC power supply, reactive sputtering (DC sputtering) was carried out to form the light shielding film 3 of CrOC to a thickness of 56 nm in contact with the phase shift film 2.

Furthermore, the transparent substrate 1 with the phase shift film 2 and the light shielding film 3 formed as layers was placed in the single-wafer RF sputtering apparatus. Using a silicon dioxide ($SiO_2$) target and an argon (Ar) gas (pressure=0.03 Pa) as a sputtering gas with an electric power of 1.5 kW from the DC power supply, RF sputtering was carried out to form the hard mask film 4 consisting of silicon and oxygen on the light shielding film 3 to a thickness of 5 nm. By the above-mentioned steps, the mask blank 100 having a structure in which the phase shift film 2, the light shielding film 3, and the hard mask film 4 are formed as layers on the transparent substrate 1 was manufactured.

[Manufacture of Phase Shift Mask]

Next, using the mask blank 100 of Example 1, the phase shift mask 200 of Example 1 was manufactured through the following steps. At first, a surface of the hard mask film 4 was subjected to HMDS treatment. Subsequently, a resist film of a chemically amplified resist for electron beam writing was formed by spin coating in contact with the surface of the hard mask film 4 to a film thickness of 80 nm. Then, on the resist film, a first pattern as a phase shift pattern to be formed on the phase shift film 2 was formed by electron beam writing. Predetermined development and predetermined cleaning were carried out to form a first resist pattern 5a having the first pattern (see FIG. 2A).

Next, using the first resist pattern 5a as a mask, dry etching using a $CF_4$ gas was carried out to form the first pattern (hard mask pattern 4a) on the hard mask film 4 (see FIG. 2B).

Then, the first resist pattern 5a was removed. Subsequently, using the hard mask pattern 4a as a mask and a mixture of chlorine and oxygen (gas flow rate ratio $Cl_2$:$O_2$=4:1), dry etching was carried out to form the first pattern (light shielding pattern 3a) on the light shielding film 3 (see FIG. 2C).

Figure 2D:
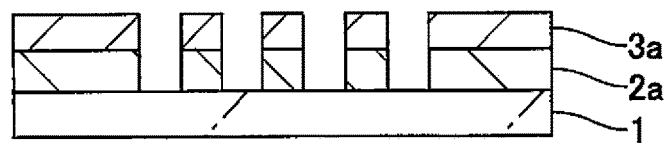
Figure 2E:
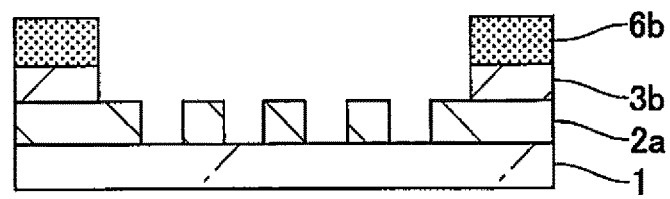
Figure 2F:
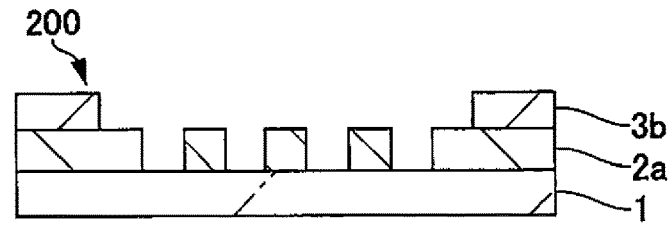

Next, with the light shielding pattern 3a used as a mask and using a fluorine-based gas (mixture of $SF_6$ and He), dry etching was carried out to form the first pattern (phase shift pattern 2a) on the phase shift film 2 and to remove the hard mask pattern 4a simultaneously (see FIG. 2D).

Next, on the light shielding pattern 3a, a resist film of a chemically amplified resist for electron beam writing was formed by spin coating to a film thickness of 150 nm. Then, on the resist film, a second pattern as a pattern (light shielding pattern) to be formed on the light shielding film 3 was written by exposure. Furthermore, a predetermined process such as development was carried out to form a second resist pattern 6b having the light shielding pattern. Subsequently, with the second resist pattern 6b used as a mask and using a mixture of chlorine and oxygen (gas flow rate ratio $Cl_2$:$O_2$=4:1), dry etching was carried out to form the second pattern (light shielding pattern 3b) on the light shielding film 3 (see FIG. 2E). Furthermore, the second resist pattern 6b was removed and, through cleaning, the phase shift mask 200 was obtained (see FIG. 2F).

The phase shift pattern 2a of the halftone phase shift mask 200 in Example 1 thus manufactured was subjected to intermittent irradiation with the ArF excimer laser light in a cumulative irradiation amount of 40 kJ/cm$^2$. CD (Critical Dimension) variation of the phase shift pattern 2a before and after the irradiation was 1.2 nm at maximum, which is the CD variation capable of assuring high transfer accuracy as the phase shift mask 200.

Through the similar steps, the halftone phase shift mask 200 in Example 1 was additionally manufactured. The phase shift mask 200 was subjected to cleaning by a chemical solution. Specifically, the phase shift mask 200 was repeatedly subjected to 20 cycles of cleaning step where one cycle includes SPM cleaning (cleaning liquid: $H_2SO_4$+$H_2O_2$) at first, rinse cleaning with DI (DeIonized) water next, APM cleaning (cleaning liquid: $NH_4OH$+$H_2O_2$+$H_2O$) next, and rinse cleaning with DI water last. The phase shift pattern 2a of the phase shift mask 200 after the cleaning was observed by a cross-sectional TEM (Transmission Electron Microscope). As a result, it has been confirmed that the phase shift pattern 2a had an excellent side wall shape. No remarkable unevenness was found between the silicon nitride layer and the silicon oxide layer.

Next, by using AIMS193 (manufactured by Carl Zeiss AG), the phase shift mask 200 of Example 1 after the cumulative irradiation with the ArF excimer laser light was subjected to simulation of a transfer image when exposure transfer onto the resist film on the semiconductor substrate was carried out with exposure light having a wavelength of 193 nm. Examining an exposure transfer image in the simulation, the design specification was fully satisfied. From this result, it is said that a circuit pattern can finally be formed on the semiconductor substrate with high accuracy when the phase shift mask 200 in Example 1 after the cumulative irradiation with the ArF excimer laser light is set on the mask stage of the exposure apparatus and exposure transfer is carried out onto the resist film on the semiconductor substrate.

Comparative Example 1

[Manufacture of Mask Blank]

A mask blank in Comparative Example 1 was manufactured through the steps similar to those for the mask blank 100 in Example 1 except that conditions of heat treatment on a phase shift film were changed. Specifically, a transparent substrate 1 provided with a phase shift film 2 in Comparative Example 1 was placed on a hot plate and subjected to heat treatment in air under conditions of a heating temperature of 280° C. and a treatment time of 30 minutes. After the heat treatment, forced cooling was carried out down to normal temperature (25° C. or lower) by using a refrigerant.

For the phase shift film after the heat treatment, a transmittance and a phase difference at a wavelength (about 193 nm) of ArF excimer laser light were measured by a phase shift measurement apparatus (MPM-193 manufactured by Lasertec Corporation). As a result, the transmittance was 21% and the phase difference was 177 degrees. In the manner similar to the case in Example 1, optical characteristics of the phase shift film were measured. As a result, a nitrogen-containing layer had a refractive index n of 2.58 and an extinction coefficient k of 0.39 at the wavelength of 193 nm whereas an oxygen-containing layer had a refractive index n of 1.59 and an extinction coefficient of 0.00 at the wavelength of 193 nm.

In the manner similar to Example 1, on a main surface of a transparent substrate newly prepared, a phase shift film was formed in the same film-forming conditions as the phase shift film in Comparative Example 1. Furthermore, heat treatment was carried out in the same conditions. Next, the transparent substrate and the phase shift film after the heat treatment were subjected to the X-ray photoelectron spectroscopy similar to that in Example 1.

Figure 4:
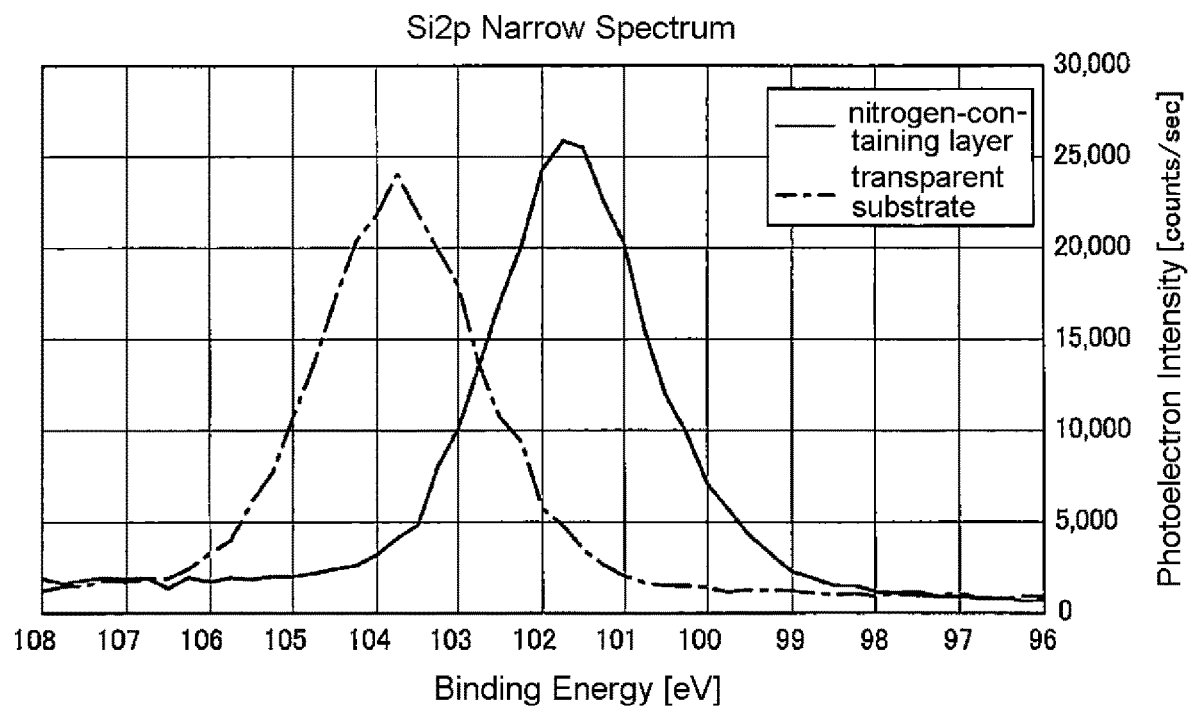
FIG. 4 is a view for illustrating a result (Si2p narrow spectrum) obtained by carrying out X-ray photoelectron spectroscopy on a phase shift film and a transparent substrate of a mask blank according to Comparative Example 1.

FIG. 4 shows an Si2p narrow spectrum of each of the nitrogen-containing layer (silicon nitride layer) of the phase shift film and the transparent substrate in Comparative Example 1. From the result of the X-ray photoelectron spectroscopy, a value (PSi_f)/(PSi_s) obtained by dividing the maximum peak PSi_f of the Si2p narrow spectrum in the nitrogen-containing layer of the phase shift film by the maximum peak PSi_s of the Si2p narrow spectrum in the transparent substrate was calculated. As a result, the value was equal to 1.096.

In the manner similar to Example 1, the Si2p narrow spectrum of the nitrogen containing layer in Comparative Example 1 was subjected to peak resolution of $Si_3N_4$ bonds, $Si_aN_b$ bonds (b/[a+b]<4/7), Si—O bonds, and SiON bonds and the proportion of existing bonds was calculated for each. As a result, the proportion of existing $Si_aN_b$ bonds was 0.093, the proportion of existing $Si_3N_4$ bonds was 0.873, and the proportion of existing Si—O bonds and existing Si—ON bonds was 0.034. Thus, the nitrogen-containing layer in Comparative Example 1 does not satisfy the condition that the ratio obtained by dividing the number of the existing $Si_3N_4$ bonds by the total number of the existing $Si_3N_4$ bonds, the existing $Si_aN_b$ bonds, the existing Si—O bonds, and the existing Si—ON bonds was 0.88 or more (0.873, not satisfactory). From the result of the X-ray photoelectron spectroscopy, it has been found out that the nitrogen-containing layer of the phase shift film in Comparative Example 1 had a composition of Si:N:O=43.8 atomic %:54.5 atomic %:1.7 atomic % and that the oxygen-containing layer had a composition of Si:O=33.9 atomic %:66.1 atomic %.

Next, in the manner similar to Example 1, a light shielding film and a hard mask film were formed on the phase shift film of the transparent substrate. By the above-mentioned steps, the mask blank in Comparative Example 1 having a structure in which the phase shift film, the light shielding film, and the hard mask film are formed as layers on the transparent substrate was manufactured.

[Manufacture of Phase Shift Mask]

Next, using the mask blank in Comparative Example 1, a phase shift mask in Comparative Example 1 was manufactured through the steps similar to those in Example 1. Furthermore, in the manner similar to Example 1, a phase shift pattern of the manufactured halftone phase shift mask in Comparative Example 1 was subjected to intermittent irradiation with the ArF excimer laser light in a cumulative irradiation amount of 40 kJ/cm$^2$. CD (Critical Dimension) variation of the phase shift pattern before and after the irradiation was 3.5 nm at maximum. Thus, the CD variation capable of assuring high transfer accuracy as the phase shift mask was not reached.

Next, using the mask blank in Comparative Example 1 and through the steps similar to those in Example 1, a halftone phase shift mask in Comparative Example 1 was additionally manufactured. The phase shift mask was subjected to cleaning by chemical solution. A phase shift pattern of the phase shift mask after the cleaning was observed by cross-sectional TEM (Transmission Electron Microscope). As a result, it has been confirmed that the phase shift pattern had a side wall shape with an unevenness between the silicon nitride layer and the silicon oxide layer.

Next, the phase shift mask in Comparative Example 1 after the cumulative irradiation with the ArF excimer laser light is subjected to simulation of a transfer image when exposure transfer onto the resist film on the semiconductor substrate was carried out with exposure light having a wavelength of 193 nm by using AIMS193 (manufactured by Carl Zeiss AG). Examining an exposure transfer image in the simulation, the design specification was not satisfied in an area of a fine pattern. From this result, it is difficult to finally form a circuit pattern on the semiconductor substrate with high accuracy when the phase shift mask in Comparative Example 1 after the cumulative irradiation with the ArF excimer laser light is set on the mask stage of the exposure apparatus and exposure transfer is carried out onto the resist film on the semiconductor substrate.

EXPLANATION OF REFERENCE NUMERALS 1 transparent substrate
2 phase shift film
2a phase shift pattern
3 light shielding film
3a, 3b light shielding pattern
4 hard mask film
4a hard mask pattern
5a first resist pattern
6b second resist pattern
100 mask blank
200 phase shift mask

The invention claimed is:

1. A mask blank comprising:
a transparent substrate; and
a phase shift film containing silicon and nitrogen, and formed on the transparent substrate,
wherein the phase shift film is a single-layer film having a composition gradient portion,
wherein the composition gradient portion is formed on a surface of the phase shift film on the side opposite from the transparent substrate and in a region adjacent to the surface, wherein the composition gradient portion is increased in oxygen content, wherein, when the phase shift film is subjected to X-ray photoelectron spectroscopy to obtain a maximum peak PSi_f of photoelectron intensity of an Si2p narrow spectrum in the phase shift film and the transparent substrate is subjected to X-ray photoelectron spectroscopy to obtain a maximum peak PSi_s of photoelectron intensity of an Si2p narrow spectrum in the transparent substrate, a numerical value (PSi_f)/(PSi_s) is 1.09 or less where the numerical value is obtained by dividing the maximum peak PSi_f in the phase shift film by the maximum peak PSi_s in the transparent substrate.

2. The mask blank according to claim 1, wherein a region of the phase shift film other than the composition gradient portion has a nitrogen content of 50 atomic % or more.

3. The mask blank according to claim 1, wherein a region of the phase shift film other than the composition gradient portion has a silicon content of 35 atomic % or more.

4. The mask blank according to claim 1, wherein a region of the phase shift film other than the composition gradient portion has an oxygen content of 10 atomic % or less.

5. The mask blank according to claim 1, wherein the maximum peak of photoelectron intensity in the Si2p narrow spectrum is the maximum peak at a bond energy within a range of 96 [eV] or more and 106 [eV] or less.

6. The mask blank according to claim 1, wherein the X-ray photoelectron spectroscopy to which the phase shift film is subjected is carried out using AlKα X-rays.

7. The mask blank according to claim 1, wherein a ratio of the proportion of $Si_3N_4$ bonds that exist in an area of the phase shift film other than the composition gradient portion to a total proportion of $Si_3N_4$ bonds, $Si_aN_b$ bonds (where $b/[a+b]<4/7$), Si—O bonds, and Si—ON bonds that exist in the area of the phase shift film other than the composition gradient portion is 0.88 or more.

8. The mask blank according to claim 1, wherein a transmittance of the phase shift film with respect to exposure light of an ArF excimer laser is 10% or more; and the phase shift film is configured to transmit the exposure light so that transmitted light has a phase difference of 150 degrees or more and 200 degrees or less with respect to the exposure light transmitted through air for a same distance as a thickness of the phase shift film.

9. The mask blank according to claim 1, comprising a light shielding film formed on the phase shift film.

10. A phase shift mask comprising:
a transparent substrate; and
a phase shift film with a transfer pattern containing silicon and nitrogen, and formed on the transparent substrate,
wherein the phase shift film is a single-layer film having a composition gradient portion,
wherein the composition gradient portion is formed on a surface of the phase shift film on the side opposite from the transparent substrate and in a region adjacent to the surface,
wherein the composition gradient portion is increased in oxygen content, wherein, when the phase shift film is subjected to X-ray photoelectron spectroscopy to obtain a maximum peak PSi_f of photoelectron intensity of an Si2p narrow spectrum in the phase shift film and the transparent substrate is subjected to X-ray photoelectron spectroscopy to obtain a maximum peak PSi_s of photoelectron intensity of an Si2p narrow spectrum in the transparent substrate, a numerical value (PSi_f)/(PSi_s) is 1.09 or less where the numerical value is obtained by dividing the maximum peak PSi_f in the phase shift film by the maximum peak PSi_s in the transparent substrate.

11. The phase shift mask according to claim 10, wherein the phase shift film other than the composition gradient portion has a nitrogen content of 50 atomic % or more.

12. The phase shift mask according to claim 10, wherein the phase shift film other than the composition gradient portion has a silicon content of 35 atomic % or more.

13. The phase shift mask according to claim 10, wherein the phase shift film other than the composition gradient portion has an oxygen content of 10 atomic % or less.

14. The phase shift mask according to claim 10, wherein the maximum peak of photoelectron intensity in the Si2p narrow spectrum is the maximum peak at a bond energy within a range of 96 [eV] or more and 106 [eV] or less.

15. The phase shift mask according to claim 10, wherein the X-ray photoelectron spectroscopy to which the phase shift film is subjected is carried out using AlKα X-rays.

16. The phase shift mask according to claim 10, wherein a ratio of the proportion of $Si_3N_4$ bonds that exist in an area of the phase shift film other than the composition gradient portion to a total proportion of $Si_3N_4$ bonds, $Si_aN_b$ bonds (where $b/[a+b]<4/7$), Si—O bonds, and Si—ON bonds that exist in the area of the phase shift film other than the composition gradient portion is 0.88 or more.

17. The phase shift mask according to claim 10, wherein a transmittance of the phase shift film with respect to exposure light of an ArF excimer laser is 10% or more; and the phase shift film is configured to transmit the exposure light so that transmitted light has a phase difference of 150 degrees or more and 200 degrees or less with respect to the exposure light transmitted through air for a same distance as a thickness of the phase shift film.

18. The phase shift mask according to claim 10, comprising a light shielding film formed on the phase shift film and provided with a light shielding pattern.

19. A method of manufacturing a semiconductor device, comprising using the phase shift mask according to claim 10 to exposure-transfer a transfer pattern to a resist film on a semiconductor substrate.

* * * * *